United States Patent
Wei et al.

(10) Patent No.: US 11,538,857 B2
(45) Date of Patent: Dec. 27, 2022

(54) BIDIRECTIONAL SELECTOR DEVICE FOR MEMORY APPLICATIONS

(71) Applicant: Avalanche Technology, Inc., Fremont, CA (US)

(72) Inventors: Zhiqiang Wei, Pleasanton, CA (US); Hongxin Yang, Newark, CA (US)

(73) Assignee: Avalanche Technology, Inc., Fremont, CA (US)

( * ) Notice: Subject to any disclaimer, the term of this patent is extended or adjusted under 35 U.S.C. 154(b) by 61 days.

(21) Appl. No.: 16/836,922

(22) Filed: Apr. 1, 2020

(65) Prior Publication Data

US 2021/0313393 A1 Oct. 7, 2021
US 2022/0352255 A9 Nov. 3, 2022

Related U.S. Application Data

(60) Continuation-in-part of application No. 16/793,349, filed on Feb. 18, 2020, now Pat. No. 11,127,787,
(Continued)

(51) Int. Cl.

| | |
|---|---|
| *G11C 11/16* | (2006.01) |
| *H01L 27/22* | (2006.01) |
| *H01L 43/02* | (2006.01) |
| *H01F 10/32* | (2006.01) |
| *H01L 45/00* | (2006.01) |

(52) U.S. Cl.
CPC .......... *H01L 27/224* (2013.01); *G11C 11/161* (2013.01); *H01F 10/329* (2013.01); *H01F 10/3259* (2013.01); *H01F 10/3286* (2013.01); *H01L 43/02* (2013.01); *H01L 45/085* (2013.01); *H01L 45/1233* (2013.01); *H01L 45/1253* (2013.01); *H01L 45/146* (2013.01)

(58) Field of Classification Search
CPC ..... H01L 27/224; H01L 43/02; H01L 45/085; H01L 45/1233; H01L 45/1253; H01L 45/146; H01F 10/3259; H01F 10/3286; H01F 10/329; G11C 11/161
USPC .......................................... 257/421
See application file for complete search history.

(56) References Cited

U.S. PATENT DOCUMENTS

| | | |
|---|---|---|
| 6,944,052 B2 | 9/2005 | Subramanian et al. |
| 9,767,901 B1 | 9/2017 | Sharma et al. |

(Continued)

*Primary Examiner* — Jami Valentine Miller
(74) *Attorney, Agent, or Firm* — Bing K. Yen

(57) ABSTRACT

The present invention is directed to a magnetic memory cell including a magnetic tunnel junction (MTJ) memory element and a two-terminal bidirectional selector coupled in series between two conductive lines. The MTJ memory element includes a magnetic free layer, a magnetic reference layer, and an insulating tunnel junction layer interposed therebetween. The two-terminal bidirectional selector includes bottom and top electrodes, first and third volatile switching layers interposed between the bottom and top electrodes, and a second volatile switching layer interposed between the first and third volatile switching layers. The bottom and top electrodes each independently include one of titanium nitride or iridium. The first and third volatile switching layers each include tantalum oxide and silver. The second volatile switching layer includes hafnium oxide and has a higher electrical resistance than the first and third volatile switching layers.

20 Claims, 8 Drawing Sheets

Related U.S. Application Data which is a division of application No. 15/863,825, filed on Jan. 5, 2018, now Pat. No. 10,593,727, which is a continuation-in-part of application No. 15/438,631, filed on Feb. 21, 2017, now Pat. No. 10,559,624, and a continuation-in-part of application No. 15/157,607, filed on May 18, 2016, now Pat. No. 10,224,367.

(56) References Cited

U.S. PATENT DOCUMENTS

| | | | |
|---|---|---|---|
| 10,096,362 B1 * | 10/2018 | Nazarian | G11C 13/004 |
| 10,593,727 B2 * | 3/2020 | Yang | G11C 11/1659 |
| 10,964,388 B2 * | 3/2021 | Jo | H01L 27/2481 |
| 2007/0159869 A1 | 7/2007 | Baek et al. | |
| 2013/0070511 A1 | 3/2013 | Wells et al. | |
| 2014/0146594 A1 | 5/2014 | Hayakawa et al. | |
| 2014/0157065 A1 | 6/2014 | Ong | |
| 2014/0209892 A1 | 7/2014 | Kuo et al. | |
| 2014/0264224 A1 | 9/2014 | Zhang et al. | |
| 2014/0319634 A1 | 10/2014 | Shukh | |
| 2015/0311252 A1 | 10/2015 | Gan et al. | |
| 2015/0325783 A1 | 11/2015 | Wang et al. | |
| 2016/0020250 A1 | 1/2016 | Li et al. | |
| 2016/0268341 A1 * | 9/2016 | Nazarian | H01L 45/1608 |
| 2017/0271406 A1 | 9/2017 | Yang et al. | |
| 2018/0062075 A1 * | 3/2018 | Jo | H01L 45/146 |
| 2018/0240845 A1 * | 8/2018 | Yang | G11C 11/1659 |
| 2019/0172871 A1 | 6/2019 | Yang et al. | |
| 2020/0006650 A1 * | 1/2020 | Wang | H01L 45/085 |
| 2021/0066584 A1 * | 3/2021 | Jo | H01L 45/1233 |

* cited by examiner

WRITING TO LOW RESISTANCE
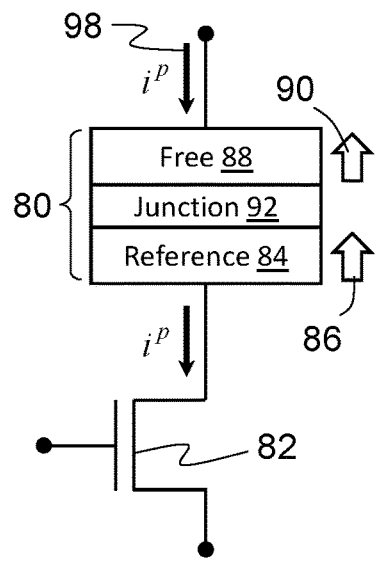
WRITING TO HIGH RESISTANCE
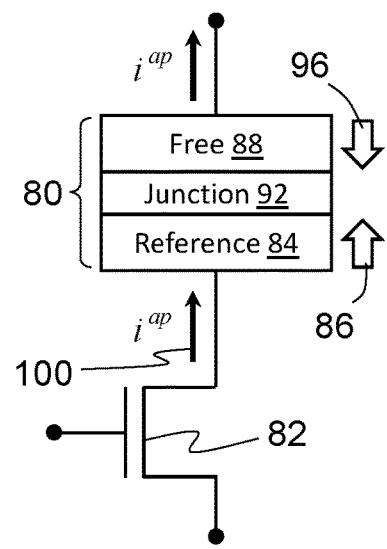
*FIG. 2A PRIOR ART*
*FIG. 2B PRIOR ART*

BIDIRECTIONAL SELECTOR DEVICE FOR MEMORY APPLICATIONS

BACKGROUND

The present invention relates to a selector device for memory applications, and more particularly, to embodiments of a two-terminal bidirectional selector device incorporating therein multiple switching layers.

Spin transfer torque magnetic random access memory (STT-MRAM) is a new class of non-volatile memory, which can retain the stored information when powered off. An STT-MRAM array normally comprises an array of magnetic memory cells, each of which includes a magnetic memory element and an access transistor coupled in series between two electrodes. The access transistor functions like a switch to direct current or voltage through the selected magnetic memory element coupled thereto. Upon application of an appropriate switching voltage or current to the selected magnetic memory element, the resistance of the magnetic memory element would change accordingly, thereby switching the stored logic in the respective memory cell.

FIG. 1 is a schematic circuit diagram of a conventional STT-MRAM array 30, which comprises a plurality of memory cells 32 with each of the memory cells 32 including an access transistor 34 coupled to a magnetic memory element 36; a plurality of parallel word lines 38 with each being coupled to the gates of a respective row of the access transistors 34 in a first direction; and a plurality of parallel bit lines 40 with each being coupled to a respective row of the magnetic memory elements 36 in a second direction substantially perpendicular to the first direction; and a plurality of parallel source lines 42 with each being coupled to a respective row of the access transistors 34 in the second direction.

The magnetic memory element 36 normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

FIGS. 2A and 2B illustrate bipolar programming operations of an STT-MRAM cell including a perpendicular MTJ memory element 80 coupled to a selection transistor 82 in series. The MTJ memory element 80 includes a magnetic reference layer 84 having an invariable or fixed magnetization direction 86 perpendicular to the layer plane thereof, a magnetic free layer 88 having a variable magnetization direction 90 or 96 perpendicular to the layer plane thereof, and a tunnel junction layer 92 interposed therebetween.

FIG. 2A illustrates the writing process for switching the resistance state of the MTJ memory element 80 from high to low. As electrons that pass through the magnetic reference layer 84 are being spin-polarized, the spin-polarized electrons exert a spin transfer torque on the magnetic free layer 88. When the spin-polarized current or parallelizing current ($i^P$) 98 exceeds a threshold level, the magnetic free layer 88 switches from the anti-parallel to parallel magnetization direction 90. It should be noted that the parallelizing write current ($i^P$) 98 flows in the opposite direction as the electrons.

Conversely, FIG. 2B illustrates the writing process for switching the resistance state of the MTJ memory element 80 from low to high. As electrons pass through the magnetic free layer 88, the electrons with the same spin direction as that of the magnetization in the magnetic reference layer 84 pass into the magnetic reference layer 84 unimpeded. However, the electrons with the opposite spin direction are reflected back to the magnetic free layer 88 at the boundary between the tunnel junction layer 92 and the magnetic reference layer 84, causing the magnetization direction 96 of the magnetic free layer 88 to switch from the parallel to anti-parallel orientation when the anti-parallelizing current ($i^{aP}$) 100 exceeds a threshold level.

The cell size of the conventional STT-MRAM memory cell 32 is limited to about 8 $F^2$, where F denotes the minimum feature size or one half the minimum feature pitch normally associated with a particular manufacturing process, because of the access transistor 34. While the access transistor 32 may be replaced by a two-terminal selector device to reduce the memory cell size down to 4 $F^2$, conventional bidirectional selector devices, such as Ovonic threshold switch, are prone to current leakage compared with access transistors.

For the foregoing reasons, there is a need for a two-terminal bidirectional selector device for memory applications that has low current leakage and that can be inexpensively manufactured.

SUMMARY

The present invention is directed to a selector device that satisfies this need. A magnetic memory cell having features of the present invention includes a magnetic tunnel junction (MTJ) electrically connected to a two-terminal bidirectional selector in series between two conductive lines. The MTJ includes a magnetic free layer having a variable magnetization direction substantially perpendicular to a layer plane thereof, a magnetic reference layer having an invariable magnetization direction substantially perpendicular to a layer plane thereof, and an insulating tunnel junction layer interposed between the magnetic free and reference layers. The two-terminal bidirectional selector includes a bottom electrode, a top electrode, first and second volatile switching layers interposed between the bottom and top electrodes. The first volatile switching layer includes a non-stoichiometric metal oxide. The second volatile switching layer includes a stoichiometric or near stoichiometric metal oxide and has a higher electrical resistance than the first volatile switching layer.

According to another aspect of the present invention, a magnetic memory cell includes a magnetic tunnel junction (MTJ) electrically connected to a two-terminal bidirectional selector in series between two conductive lines. The MTJ includes a magnetic free layer having a variable magnetization direction substantially perpendicular to a layer plane thereof, a magnetic reference layer having an invariable magnetization direction substantially perpendicular to a layer plane thereof, and an insulating tunnel junction layer interposed between the magnetic free and reference layers. The two-terminal bidirectional selector includes a bottom electrode, a top electrode, first and second volatile switching layers interposed between the bottom and top electrodes. The first volatile switching layer includes a non-stoichiometric tantalum oxide and a metal dopant. The second volatile switching layer includes hafnium oxide and has a higher electrical resistance than the first volatile switching layer. The metal dopant is silver or copper.

According to still another aspect of the present invention, a magnetic memory cell includes a magnetic tunnel junction (MTJ) electrically connected to a two-terminal bidirectional selector in series between two conductive lines. The MTJ includes a magnetic free layer having a variable magnetization direction substantially perpendicular to a layer plane thereof, a magnetic reference layer having an invariable magnetization direction substantially perpendicular to a layer plane thereof, and an insulating tunnel junction layer interposed between the magnetic free and reference layers. The two-terminal bidirectional selector includes bottom and top electrodes with each independently comprising one of titanium nitride or iridium, first and third volatile switching layers interposed between the bottom and top electrodes and include tantalum oxide and silver, and a second volatile switching layer interposed between the first and third volatile switching layers. The second volatile switching layer includes hafnium oxide and has a higher electrical resistance than the first and third volatile switching layers.

BRIEF DESCRIPTION OF THE DRAWINGS

These and other features, aspects, and advantages of the present invention will become better understood with regard to the following description, appended claims, and accompanying drawings where:

FIGS. 2A and 2B illustrate switching of magnetic tunnel junction from high to low resistance state and from low to high resistance state, respectively;

For purposes of clarity and brevity, like elements and components will bear the same designations and numbering throughout the Figures, which are not necessarily drawn to scale.

DETAILED DESCRIPTION

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

Figure 1:
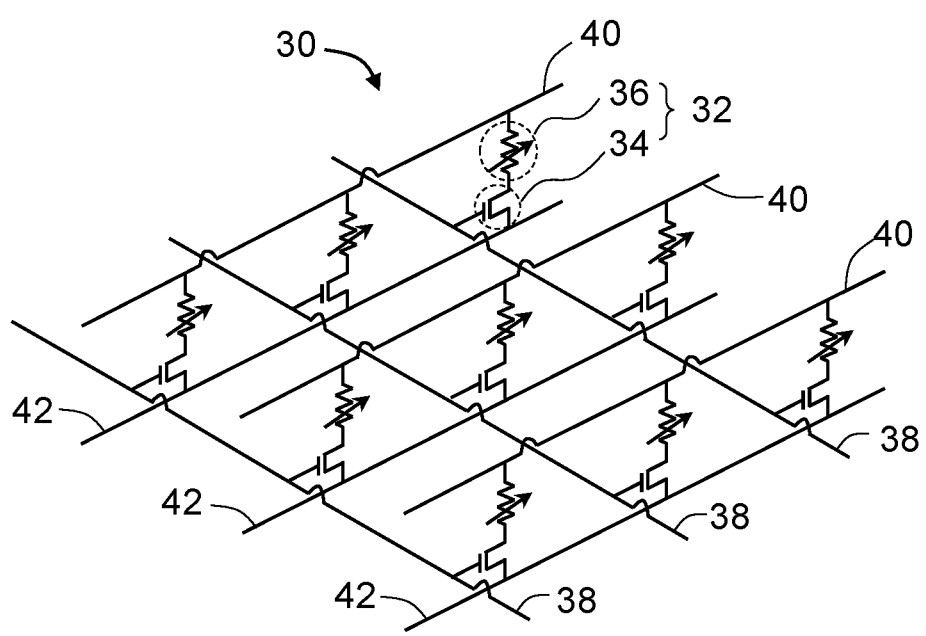
FIG. 1 is a schematic circuit diagram for a conventional STT-MRAM array incorporating access transistors in magnetic memory cells.
Figure 3:
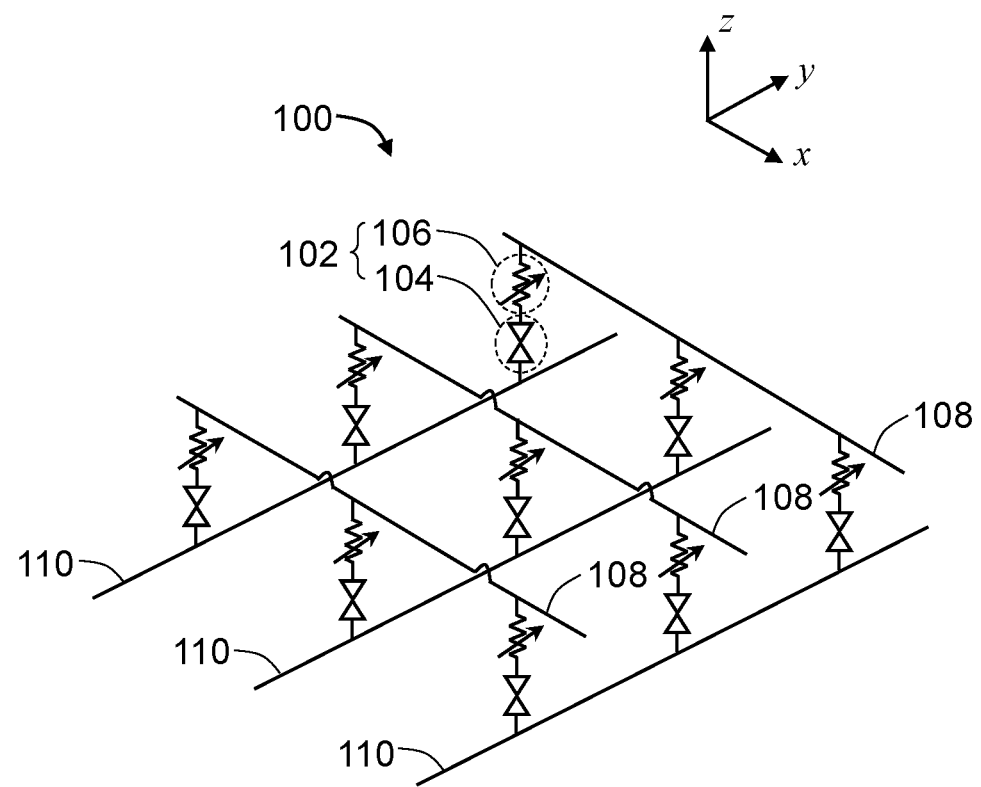
FIG. 3 is a schematic circuit diagram for an STT-MRAM array including incorporating two-terminal bidirectional selectors in magnetic memory cells.

FIG. 3 is a schematic circuit diagram of an exemplary STT-MRAM array incorporating two-terminal bidirectional selectors in magnetic memory cells. The MRAM array 100 comprises a plurality of magnetic memory cells 102 with each of the magnetic memory cells 102 including a two-terminal bidirectional selector 104 coupled to an MTJ memory element 106 in series; a plurality of first conductive lines 108 with each being coupled to a respective row of the MTJ memory elements 106 in the x-direction; and a plurality of second conductive lines 110 with each being coupled to a respective column of the bidirectional selectors 104 in the y-direction substantially perpendicular to the x-direction. Accordingly, the magnetic memory cells 102 are located at the cross points between the first and second conductive lines 108 and 110. The stacking order of the MTJ memory elements 106 and the selectors 104 may be inverted such that the MTJ memory elements 106 and the selectors 104 are disposed adjacent to the second and first conductive lines 110 and 108, respectively. The first and second conductive lines 108 and 110 may function as word lines and bit lines, respectively. Alternatively, The first and second conductive lines 108 and 110 may function as bit lines and word lines, respectively.

Figure 4A:
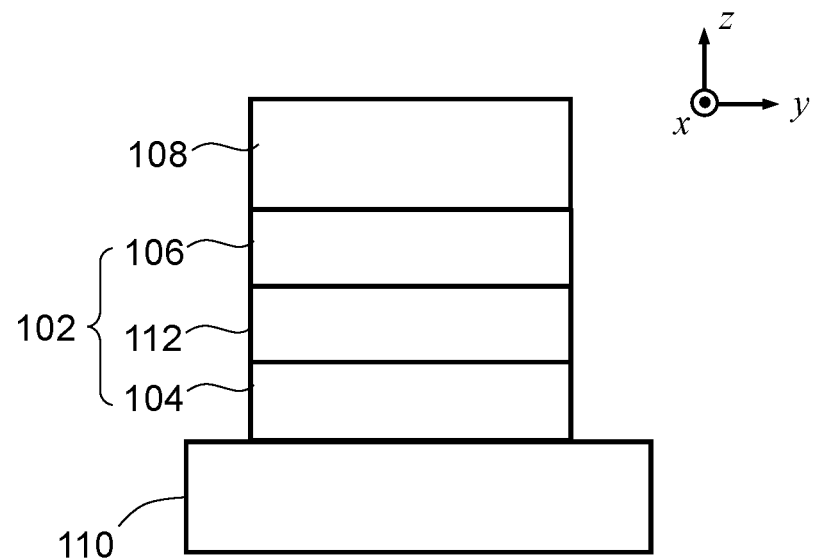
FIGS. 4A and 4B are cross-sectional views of a magnetic memory cell in accordance with different embodiments of the present invention.

An embodiment of the present invention as applied to the magnetic memory cells 102 of FIG. 3 will now be described with reference to FIG. 4A, which is a cross-sectional view of one of the magnetic memory cells 102. Referring now to FIG. 4A, a magnetic memory cell 102 includes a bidirectional selector 104 formed on top of a second conductive line 110, an MTJ memory element 106 formed on top of the bidirectional selector 104, and an optional intermediate electrode 112, if present, interposed between the bidirectional selector 104 and the MTJ memory element 106. In embodiments where the optional intermediate electrode 112 is absent, the magnetic memory element 106 may be directly coupled to the bidirectional selector 104. The magnetic memory cell 102 may be electrically connected to the first conductive line 108 and/or the second conductive line 110 via one or more intervening electrodes (not shown).

Figure 4B:
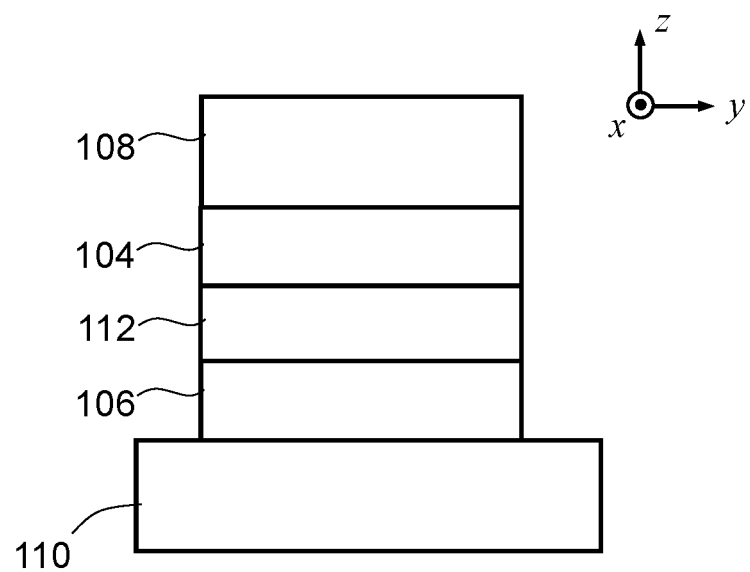

The stacking order of the bidirectional selector 104 and the MTJ memory element 106 may be inverted, as illustrated in FIG. 4B, such that the bidirectional selector 104 is formed on top of the magnetic memory element 106 with the optional intermediate electrode 112 interposed therebetween.

The first and second conductive lines 108 and 110 may each independently comprise any suitable conductor, such as but not limited to copper (Cu), tungsten (W), aluminum (Al), silver (Ag), gold (Au), titanium (Ti), ruthenium (Ru), iridium (Ir), platinum (Pt), palladium (Pd), tantalum (Ta), titanium nitride ($TiN_x$), tantalum nitride ($TaN_x$), or any combination thereof.

The optional intermediate electrode 112 may comprise any suitable conductor, such as but not limited to copper (Cu), tungsten (W), aluminum (Al), silver (Ag), gold (Au), titanium (Ti), ruthenium (Ru), iridium (Ir), platinum (Pt), palladium (Pd), tantalum (Ta), titanium nitride ($TiN_x$), tantalum nitride ($TaN_x$), tungsten silicide ($WSi_x$), titanium silicide ($TiSi_x$), cobalt silicide ($CoSi_x$), nickel silicide ($NiSi_x$), platinum silicide ($PtSi_x$), or any combination thereof.

The MTJ memory element 106 may include a magnetic free layer having a variable magnetization direction substantially perpendicular to a layer plane thereof, a magnetic reference layer having an invariable magnetization direction substantially perpendicular to a layer plane thereof, and an insulating tunnel junction layer interposed therebetween. Alternatively, the magnetic free and reference layers may have magnetization directions that are oriented parallel to the layer planes thereof.

Figure 5A:
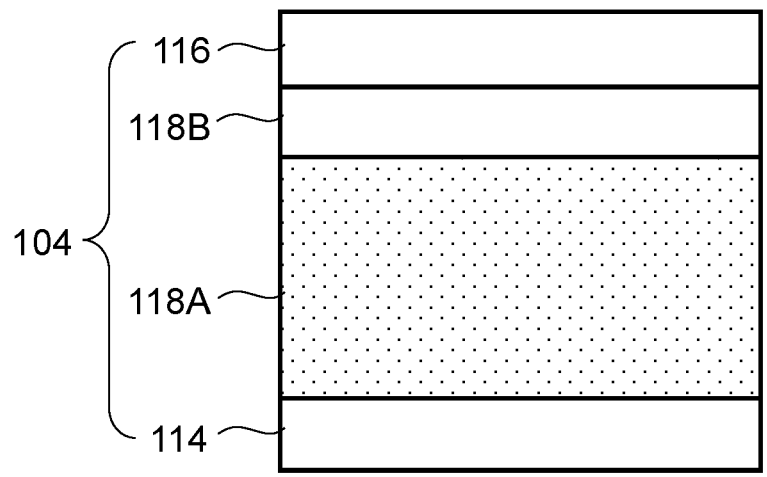
FIGS. 5A and 5B are cross-sectional views illustrating the structure of a two-terminal bidirectional selector in accordance with an embodiment of the present invention.

FIG. 5A is a cross-sectional view illustrating the structure of the two-terminal bidirectional selector 104 in accordance with an embodiment of the present invention. The selector 104 includes a bottom electrode 114, a top electrode 116, and first and second volatile switching layers 118A and 118B interposed between the bottom and top electrodes 114 and 116. The first and second volatile switching layers 118A and 118B have different compositions and electrical resistances. The stacking order of the first and second volatile switching layers 118A and 118B may be inverted, such that the first and second volatile switching layers 118A and 118B are formed adjacent to the top and bottom electrodes 116 and 114, respectively.

The first volatile switching layer 118A may have a relatively lower electrical resistance than the second volatile switching layer 118B and may comprise a suitable oxide, which may be further doped with one or more conductive elements. The oxide may be stoichiometric or non-stoichiometric (i.e., metal-rich). Examples of the suitable oxide for the first volatile switching layer 118A may include tantalum oxide ($TaO_x$), titanium oxide ($TiO_x$), aluminum oxide ($AlO_x$), zinc oxide ($ZnO_x$), tungsten oxide ($WO_x$), hafnium oxide ($HfO_x$), niobium oxide ($NbO_x$), magnesium oxide ($MgO_x$), gallium oxide ($GaO_x$), and gadolinium oxide ($GdO_x$). Examples of the conductive element dopant may include silver (Ag), gold (Au), copper (Cu), nickel (Ni), tellurium (Te), and cobalt (Co).

The second volatile switching layer 118B may comprise a suitable stoichiometric or non-stoichiometric (i.e., metal-rich) oxide, such as but not limited to tantalum oxide ($TaO_y$), aluminum oxide ($AlO_y$), zinc oxide ($ZnO_y$), zirconium oxide ($ZrO_y$), tungsten oxide ($WO_y$), hafnium oxide ($HfO_y$), niobium oxide ($NbO_y$), magnesium oxide ($MgO_y$), gallium oxide ($GaO_y$), gadolinium oxide ($GdO_y$), and silicon oxide ($SiO_y$). The oxide of the second volatile switching layer 118B may have a higher electrical resistivity than the oxide of the first volatile switching layer 118A.

In an embodiment, the first volatile switching layer 118A is made of a same oxide as the second volatile switching layer 118B but has a higher metal content in the oxide to decrease the electrical resistance. For example, the first and second volatile switching layers 118A and 118B may comprise a non-stoichiometric and stoichiometric tantalum oxide, respectively. Alternatively, the first and second volatile switching layers 118A and 118B may comprise $TaO_x$ and $TaO_y$, respectively, where y>x. Alternatively, the first and second volatile switching layers 118A and 118B may comprise a non-stoichiometric and stoichiometric hafnium oxide, respectively. The non-stoichiometric tantalum oxide or hafnium oxide of the first volatile switching layer 118A may be further doped with a conductive element, such as silver, copper, nickel, or tellurium. In another embodiment, the first and second volatile switching layers 118A and 118B are made of different oxides. For example, the first and second volatile switching layers 118A and 118B may comprise tantalum oxide and hafnium oxide, respectively. The hafnium oxide may be stoichiometric or near stoichiometric, while the tantalum oxide may be non-stoichiometric and/or doped with silver, copper, nickel, or tellurium.

The bottom and top electrodes 114 and 116 may each independently comprise any suitable electrode material, such as but not limited to platinum (Pt), iridium (Ir), ruthenium (Ru), palladium (Pd), titanium (Ti), tungsten (W), tantalum (Ta), aluminum (Al), copper (Cu), indium-tin oxide (ITO), gold (Au), silver (Ag), nickel (Ni), titanium nitride ($TiN_t$), tantalum nitride ($TaN_x$), or any combination thereof. In one embodiment, the bottom and top electrodes 114 and 116 are made of the same material, or are "symmetric" with respect to the switching layers 118A and 118B. For example, the bottom and top electrodes 114 and 116 may both be made of iridium, tantalum, tantalum nitride, or titanium nitride. In an alternative embodiment, the bottom and top electrodes 114 and 116 are made of different materials, or are "asymmetric" with respect to the switching layers 118A and 118B.

Figure 5B:
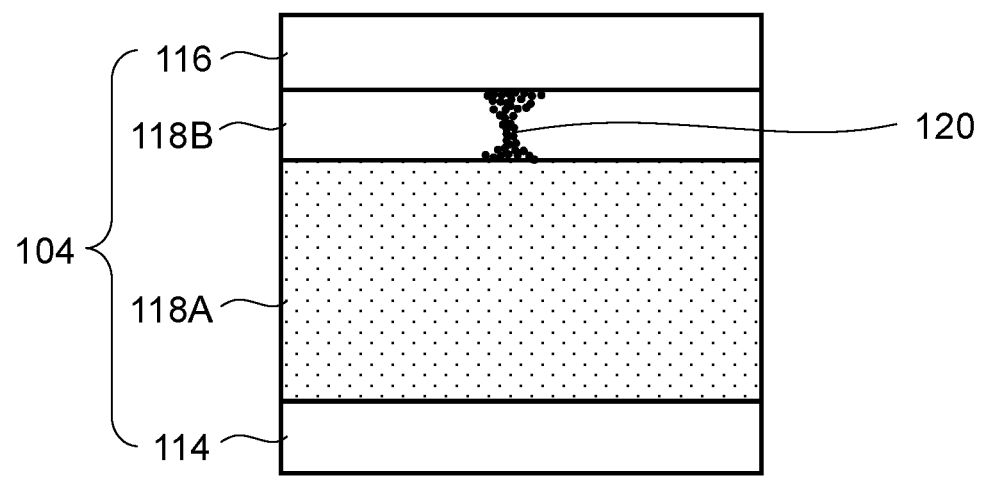

Being a volatile device, the selector 104 shown in FIG. 5A is essentially non-conductive in the absence of a voltage applied to the two electrodes 114 and 116. However, when a voltage sufficiently high (i.e., switching voltage) is applied to the selector 104, a conductive filament 120 may form in the second volatile switching layer 118B as shown in FIG. 5B, thereby rendering the selector 104 conductive. The conductive filament 120 may comprise metal atoms and/or ions from the metal-rich oxide of the first volatile switching layer 118A or conductive dopants from the first volatile switching layer 118A. After applying the switching voltage one or more times, some of the metal atoms and/or ions of the conductive filament may remain in the second volatile switching layer 118B even in the absence of an applied voltage.

Figure 6A:
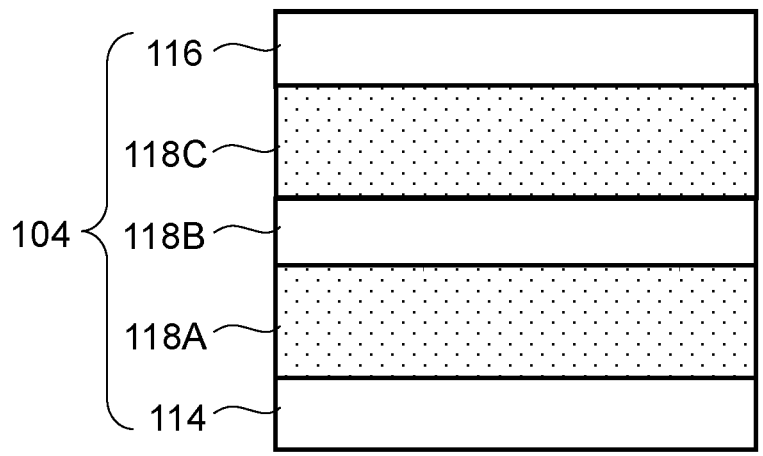
FIGS. 6A and 6B are cross-sectional views illustrating the structure of a two-terminal bidirectional selector in accordance with another embodiment of the present invention.

FIG. 6A is a cross-sectional view illustrating the structure of the two-terminal bidirectional selector 104 in accordance with another embodiment of the present invention. In the drawing, numerals 114-118A and 118B denote the same components as those shown in FIG. 5A. The embodiment of FIG. 6A is different from the embodiment of FIG. 5A in that the selector 104 includes a third volatile switching layer 118C formed adjacent to the second volatile switching layer 118B opposite the first volatile switching layer 118A. The second and third volatile switching layers 118B and 118C have different compositions and electrical resistances. The stacking order of the first, second, and third volatile switching layers 118A, 118B, 118C may be inverted, such that the first and third volatile switching layers 118A and 118C are formed adjacent to the top and bottom electrodes 116 and 114, respectively.

Analogous to the first volatile switching layer 118A, the third volatile switching layer 118C may have a relatively lower electrical resistance than the second volatile switching layer 118B and may independently comprise a suitable oxide, which may be further doped with one or more conductive elements. The oxide may be stoichiometric or non-stoichiometric (i.e., metal-rich). Examples of the suitable oxide for the third volatile switching layer 118C may include tantalum oxide ($TaO_x$), titanium oxide ($TiO_x$), aluminum oxide ($AlO_x$), zinc oxide ($ZnO_x$), tungsten oxide ($WO_x$), hafnium oxide ($HfO_x$), niobium oxide ($NbO_x$), magnesium oxide ($MgO_x$), gallium oxide ($GaO_x$), and gadolinium oxide ($GdO_x$). The oxide of the third volatile switching layer 118C may have a lower electrical resistivity than the oxide of the second volatile switching layer 118B. Examples of the conductive element dopant may include silver (Ag), gold (Au), copper (Cu), nickel (Ni), tellurium (Te), and cobalt (Co).

In an embodiment, the first and third volatile switching layers 118A and 118C have a same composition. For example, the first and third volatile switching layers 118A and 118C may comprise a same oxide, such as tantalum oxide or hafnium oxide, which may be further doped with silver or copper. In another embodiment, the first and third volatile switching layers 118A and 118C may each comprise a non-stoichiometric tantalum oxide doped with silver, and the second volatile switching layer 118B may comprise hafnium oxide, which may be stoichiometric or near stoichiometric.

Figure 6B:
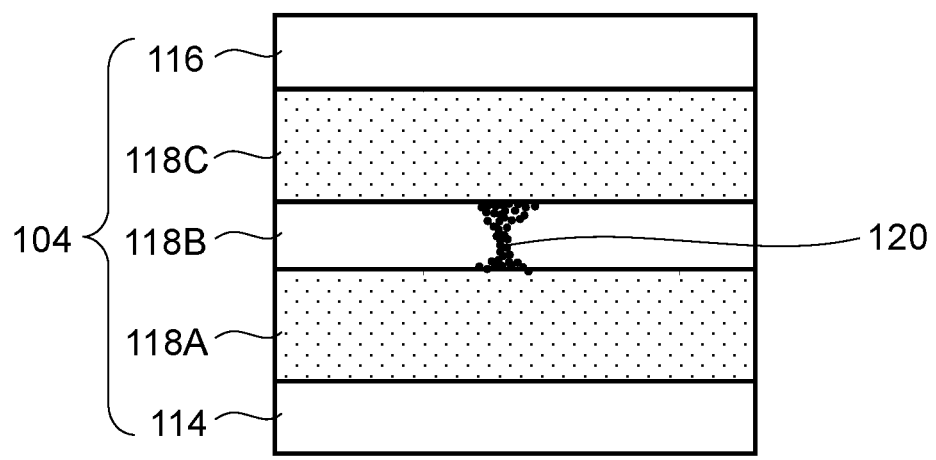

Analogous to the embodiment of FIG. 5B, FIG. 6B shows that when a voltage sufficiently high (i.e., switching voltage) is applied to the selector 104, a conductive filament 120 may form in the second volatile switching layer 118B, thereby rendering the selector 104 conductive. The conductive filament 120 may comprise metal atoms and/or ions from at least one of the metal-rich oxides of the first and third volatile switching layers 118A and 118C or conductive dopants from at least one of the first and third volatile switching layers 118A and 118C. After applying the switching voltage one or more times, some of the metal atoms and/or ions of the conductive filament may remain in the second volatile switching layer 118B even in the absence of an applied voltage.

Operation of the two-terminal bidirectional selectors 104 of embodiments of FIGS. 5A/B and 6A/B will now be described with reference to the current-voltage (I-V) response plot illustrated in FIG. 7. The exemplary I-V plot shows the magnitude of electric current passing through the selectors 104 without a load coupled thereto as the applied voltage varies. Initially, the selectors 104 are in a high resistance state as the current gradually increases with the applied voltage from zero to near a threshold voltage, $V_{th}$. At or near $V_{th}$, the current rapidly increases and exhibits a highly non-linear behavior, indicating a transition from the high resistance state to a conductive state for the selectors 104. As the voltage continues to increase beyond $V_{th}$, the current increase becomes gradual again until reaching $i_{on}$ and corresponding voltage $V_p$, which are programming current and voltage for the MTJ memory element 106, respectively. The current response behaves like a step function as the applied voltage increases from zero to $V_p$ with the sharp increase occurring at or near $V_{th}$, which may include a narrow range of voltage values.

Without being bound to any theory, it is believed that at least one conductive filament is formed within the second switching layer 118B, as illustrated in FIGS. 5B and 6B, when the selector voltage exceeds $V_{th}$, resulting in the selectors 104 being in a highly conductive state. In response to the applied voltage that is greater than $V_{th}$, dopants and/or metal atoms or ions from at least one of the first and third volatile switching layers 118A and 118C may migrate into the second volatile switching layer 118B to form a conductive filament, thereby forming a conductive path between the bottom and top electrodes 114 and 116. It is also possible that metal atoms or ions within the second volatile switching layer 118B may migrate or diffuse to form the conductive filament 120. Therefore, the metal atoms or ions for forming the conductive filament 120 may come from at least one of the first and third volatile switching layers 118A and 118C, or the second volatile switching layer 118B, or both. It should be noted that there are various possible mechanisms that can cause ions to migrate or diffuse, such as but not limited to electric field, electric current, and joule heating, in the presence of the applied voltage.

Figure 7:
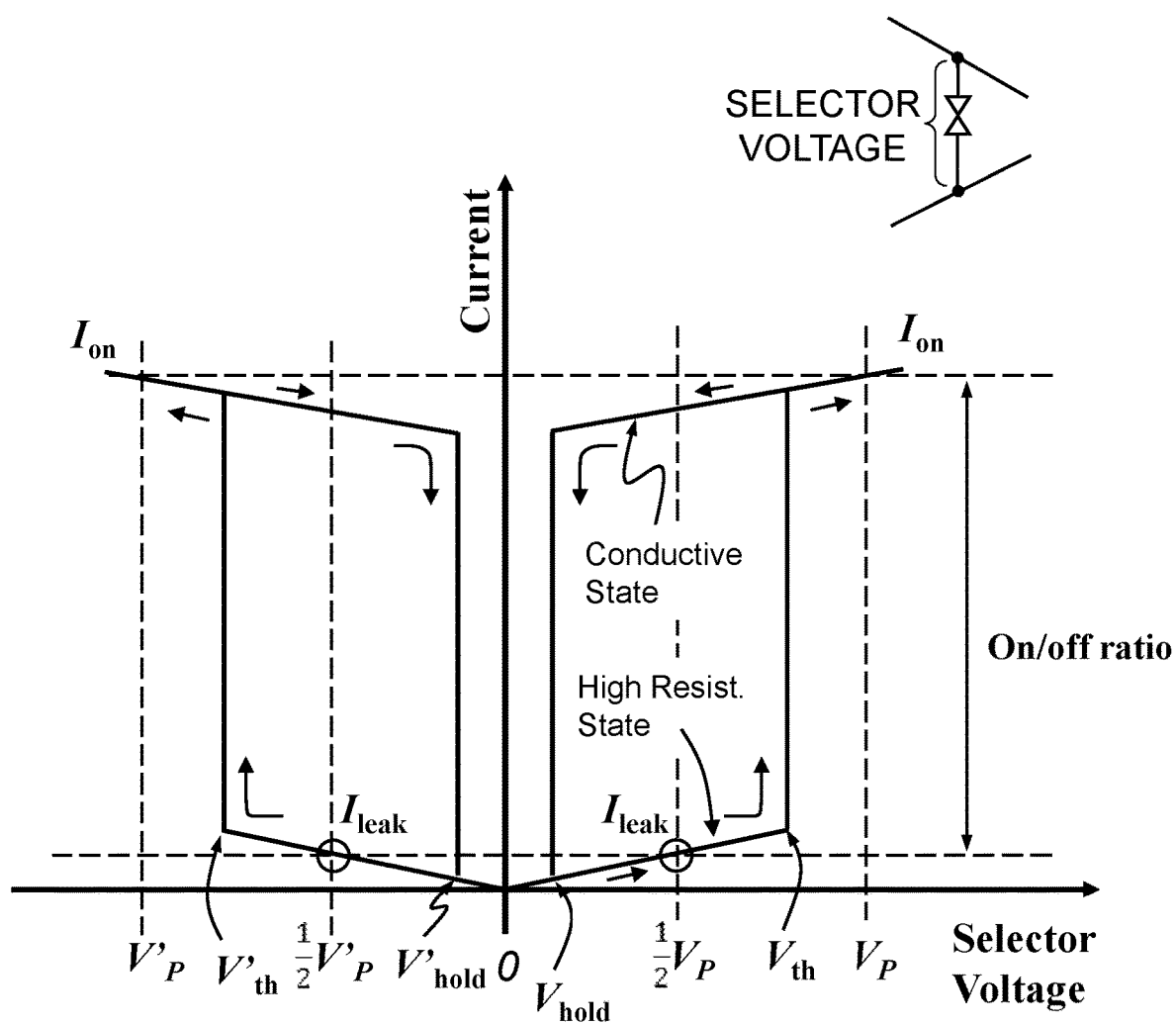
FIG. 7 is an exemplary I-V response plot corresponding to the selectors of embodiments of FIGS. 5A/B and 6A/B.

With continuing reference to FIG. 7, as the selector voltage decreases from $V_p$ to near a holding voltage, $V_{hold}$, that is lower than $V_{th}$, the current gradually decreases and the selectors 104 remain in the highly conductive state. The conductive filament 120 previously formed in the second volatile switching layer 118B may remain mostly intact as illustrated in FIGS. 5B and 6B.

At or near $V_{hold}$, the selector current rapidly decreases and exhibits a highly non-linear behavior, indicating a transition from the highly conductive state back to the high resistance state. As the voltage continues to decrease beyond $V_{hold}$, the current decrease becomes gradual again. When the voltage drops below $V_{hold}$, the conductive filament 120 may disintegrate, returning the selectors 104 back to the high resistance state. At zero voltage, the conductive filament 120 may remain disintegrated and the second volatile switching layer 118B remains in the original high resistance state.

The I-V response of the selectors 104 of the embodiments of FIGS. 5A/B and 6A/B is characterized by a hysteresis behavior as the applied voltage increases from zero to $V_p$ and decreases back to zero again as illustrated in FIG. 7. The current response behaves like a step function as the applied voltage increases from zero to $V_p$ with the sharp increase occurring at or near $V_{th}$, which marks the transition from the high resistance state to the conductive state. As the voltage decreases from $V_p$ to zero, the current markedly decreases at or near $V_{hold}$, which is lower than $V_p$ and marks the transition from the conductive state back to the high resistance state. Accordingly, when the selector voltage is between $V_{hold}$ and $V_{th}$, the selectors 104 may be in either the conductive state or the high resistance state. The difference in the electrical resistance between the conductive state and the high resistance state at a given selector voltage may range from five to eight orders of magnitude.

The two-terminal selectors 104 of the embodiments of FIGS. 5A/B and 6A/B are bidirectional as the polarity of the applied voltage may be reversed as illustrated in the I-V plot of FIG. 7. The IV-response corresponding to the opposite polarity is also characterized by a hysteresis behavior as the applied voltage increases from zero to $V'_p$ and decreases back to zero again. As the selector voltage increases from zero to $V'_p$, a sharp rise in current at or near $V'_{th}$, indicating the transition from the high resistance state to the conductive state. As the selector voltage decreases from $V'_p$ back to zero, a sharp drop in current at or near $V'_{hold}$, which is lower than $V'_{th}$ and marks the transition from the conductive state back to the high resistance state.

While the two I-V loops corresponding to the two opposite voltage polarities, as shown in FIG. 7, are substantially symmetric with respect to the vertical current axis (i.e., $V_{th}$ $V'_{th}$ and $V_{hold} \neq V'_{hold}$), the selectors 104 of the embodiments of FIGS. 5A/B and 6A/B may alternatively exhibit asymmetric I-V response loops (i.e., $V_{th} \neq V'_{th}$ and/or $V_{hold} \neq V'_{hold}$), depending on the compositions of the volatile switching layers 118A-118C and the electrodes 114 and 116.

Figure 8A:
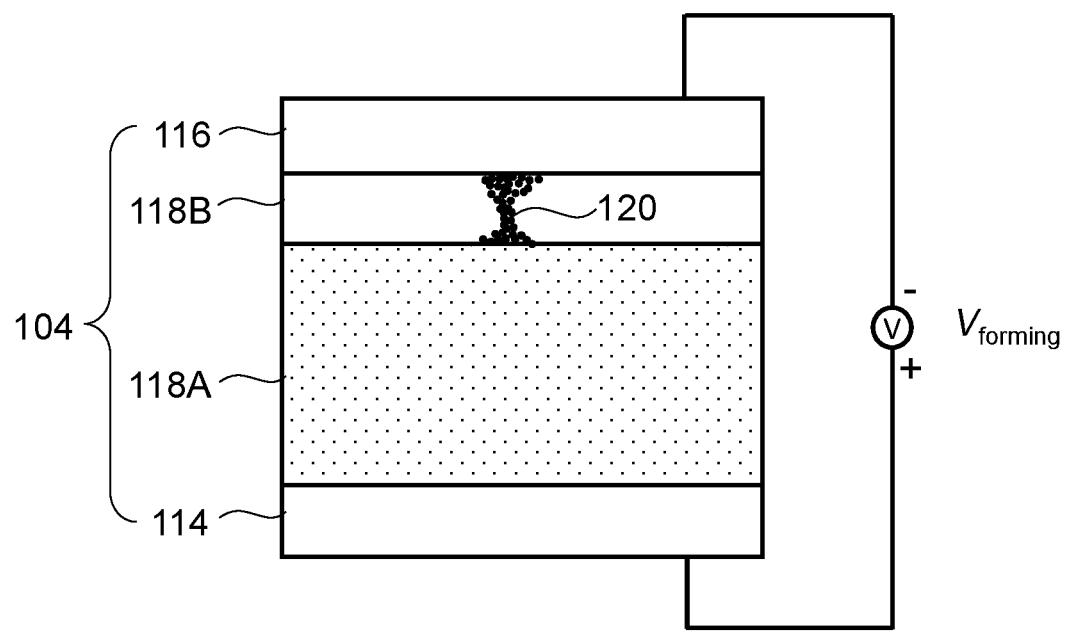
FIGS. 8A and 8B illustrate the process of forming to create an initial conductive filament in a volatile switching layer for the selector embodiments of FIGS. 5A/B and 6A/B, respectively.
Figure 8B:
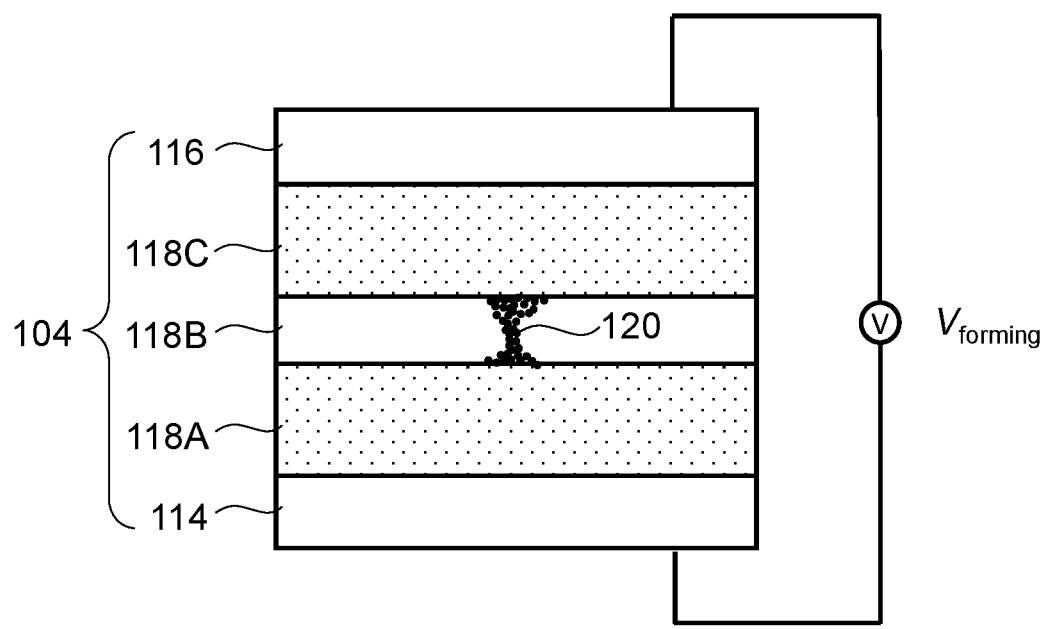

The process of forming may be applied to the selectors 104 of the embodiments of FIGS. 5A/B and 6A/B to form an initial conductive filament in the as-deposited second volatile switching layer 118B prior to operation. FIG. 8A shows that a forming voltage, $V_{forming}$, which is equal to or greater than $V_{th}$, is applied to the selector 104 of FIGS. 5A/B to form the initial filament 120 in the second volatile switching layer 118B. The forming voltage may exert an electric field that causes dopants and/or metal ions in the first volatile switching layer 118A to migrate or diffuse into the second volatile switching layer 118B to form the initial conductive filament 120. Likewise, FIG. 8B shows the forming voltage being applied to the selector 104 of FIGS. 6A/B to form the initial filament 120 in the second volatile switching layer 118B. The forming voltage may exert an electric field that causes dopants and/or metal ions in the first or third volatile switching layer 118A or 118C to migrate or diffuse into the second volatile switching layer 118B to form the initial conductive filament 120. The forming process may ensure that only one conductive filament is formed in the second volatile switching layer 118B when the selector is in the conductive state. Sidewall oxidation of the selector may further help to centralize the conductive filament, thereby ensuring only one conductive filament is formed in the second volatile switching layer 118 of a selector.

Compared to the threshold switching selectors 104 of the embodiments of FIGS. 5A/B and 6A/B characterized by distinctive insulating and conductive states, whose electrical resistances may differ by more than 6 orders of magnitude at a given applied voltage (i.e., between $V_{th}$ and $V_{hold}$), conventional bidirectional selectors that conduct current via electron tunneling mechanism do not exhibit a clear threshold effect. Instead, the current simply increases and decreases non-linearly with the applied voltage without showing the I-V hysteresis loop, which may cause conventional bidirectional selectors to have high current leakage.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A magnetic memory cell comprising:
  a magnetic tunnel junction (MTJ) including:
    a magnetic free layer having a variable magnetization direction substantially perpendicular to a layer plane of said magnetic free layer;
    a magnetic reference layer having an invariable magnetization direction substantially perpendicular to a layer plane of said magnetic reference layer; and
    an insulating tunnel junction layer interposed between said magnetic free and reference layers; and
  a two-terminal bidirectional selector electrically connected to said MTJ and including:
    a bottom electrode;
    a top electrode;
    a first volatile switching layer interposed between said bottom and top electrodes, said first volatile switching layer comprising a non-stoichiometric tantalum oxide and a metal dopant; and
    a second volatile switching layer interposed between said bottom and top electrodes, said second volatile switching layer comprising hafnium oxide and having a higher electrical resistance than said first volatile switching layer.

2. The magnetic memory cell of claim 1, wherein a current-voltage response of said two-terminal bidirectional selector is characterized by a hysteresis loop.

3. The magnetic memory cell of claim 1, wherein said two-terminal bidirectional selector has two distinct electrical resistances at an applied voltage.

4. The magnetic memory cell of claim 1, wherein only single conductive filament is formed in said second volatile switching layer when said two-terminal bidirectional selector is in a conductive state.

5. The magnetic memory cell of claim 1, wherein said metal dopant is silver or copper.

6. The magnetic memory cell of claim 1, wherein said metal dopant is one of tellurium, nickel, or cobalt.

7. The magnetic memory cell of claim 1, wherein said hafnium oxide has a stoichiometric or near stoichiometric composition.

8. The magnetic memory cell of claim 1, wherein said bottom and top electrodes have a same composition.

9. The magnetic memory cell of claim 1, wherein said bottom and top electrodes each independently comprise one of titanium nitride or iridium.

10. The magnetic memory cell of claim 1, wherein said bottom and top electrodes each independently comprise one of tantalum nitride, tantalum, or ruthenium.

11. The magnetic memory cell of claim 1, wherein said two-terminal bidirectional selector further includes a third volatile switching layer formed adjacent to said second volatile switching layer opposite said first volatile switching layer, said third volatile switching layer comprising said non-stoichiometric tantalum oxide and silver.

12. A magnetic memory cell comprising:
  a magnetic tunnel junction (MTJ) including:
    a magnetic free layer having a variable magnetization direction substantially perpendicular to a layer plane of said magnetic free layer;
    a magnetic reference layer having an invariable magnetization direction substantially perpendicular to a layer plane of said magnetic reference layer; and
    an insulating tunnel junction layer interposed between said magnetic free and reference layers; and
  a two-terminal bidirectional selector electrically connected to said MTJ and including:
    a bottom electrode;
    a top electrode;
    a first volatile switching layer interposed between said bottom and top electrodes, said first volatile switching layer comprising a non-stoichiometric metal oxide; and
    a second volatile switching layer interposed between said bottom and top electrodes, said second volatile switching layer comprising a stoichiometric or near stoichiometric metal oxide and having a higher electrical resistance than said first volatile switching layer.

13. The magnetic memory cell of claim 12, wherein a current-voltage response of said two-terminal bidirectional selector is characterized by a hysteresis loop.

14. The magnetic memory cell of claim 12, wherein only single conductive filament is formed in said second volatile switching layer when said two-terminal bidirectional selector is in a conductive state.

15. The magnetic memory cell of claim 12, wherein said stoichiometric or near stoichiometric metal oxide has higher electrical resistivity than said non-stoichiometric metal oxide.

16. The magnetic memory cell of claim 12, wherein said first volatile switching layer further comprises a metal dopant.

17. The magnetic memory cell of claim 12, wherein said two-terminal bidirectional selector further includes a third volatile switching layer formed adjacent to said second volatile switching layer opposite said first volatile switching layer, said third volatile switching layer comprising said non-stoichiometric metal oxide.

18. A magnetic memory cell comprising:
a magnetic tunnel junction (MTJ) including:
  a magnetic free layer having a variable magnetization direction substantially perpendicular to a layer plane of said magnetic free layer;
  a magnetic reference layer having an invariable magnetization direction substantially perpendicular to a layer plane of said magnetic reference layer; and
  an insulating tunnel junction layer interposed between said magnetic free and reference layers; and
a two-terminal bidirectional selector electrically connected to said MTJ and including:
  bottom and top electrodes each independently comprising one of titanium nitride or iridium;
  first and third volatile switching layers interposed between said bottom and top electrodes, said first and third volatile switching layers comprising tantalum oxide and silver; and
  a second volatile switching layer interposed between said first and third volatile switching layers, said second volatile switching layer comprising hafnium oxide and having a higher electrical resistance than said first and third volatile switching layers.

19. The magnetic memory cell of claim 18, wherein a current-voltage response of said two-terminal bidirectional selector is characterized by a hysteresis loop.

20. The magnetic memory cell of claim 18, wherein only single conductive filament is formed in said second volatile switching layer when said two-terminal bidirectional selector is in a conductive state.

\* \* \* \* \*